US007372352B2

(12) United States Patent
Lee et al.

(10) Patent No.: US 7,372,352 B2
(45) Date of Patent: May 13, 2008

(54) TRANSFORMER FOR VARYING INDUCTANCE VALUE

(75) Inventors: Young-Jae Lee, Daejon (KR); Cheon-Soo Kim, Daejon (KR); Hyun-Kyu Yu, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 441 days.

(21) Appl. No.: 11/213,552

(22) Filed: Aug. 26, 2005

(65) Prior Publication Data

US 2006/0132274 A1    Jun. 22, 2006

(30) Foreign Application Priority Data

Dec. 16, 2004    (KR) .................. 10-2004-0107114

(51) Int. Cl.
*H01F 5/00*    (2006.01)
(52) U.S. Cl. ..................................... 336/200
(58) Field of Classification Search .......... 336/65, 336/83, 192, 200, 232; 257/531
See application file for complete search history.

(56) References Cited

U.S. PATENT DOCUMENTS

| | | | |
|---|---|---|---|
| 6,707,367 B2 * | 3/2004 | Castaneda et al. | 336/200 |
| 6,927,664 B2 * | 8/2005 | Nakatani et al. | 336/200 |
| 7,151,430 B2 * | 12/2006 | Mattsson | 336/200 |
| 2005/0068146 A1 * | 3/2005 | Jessie | 336/200 |
| 2006/0033602 A1 * | 2/2006 | Mattsson | 336/200 |
| 2007/0052512 A1 * | 3/2007 | Jeon et al. | 336/200 |
| 2007/0115086 A1 * | 5/2007 | Cairo Molins | 336/200 |

FOREIGN PATENT DOCUMENTS

KR    1020040042130    5/2004

OTHER PUBLICATIONS

"Demonstration of a Switched Resonator Concept ina Dual-Band Monolithic CMOS LC-Tuned VCO", Seong-Mo Yim, et al., 2001 IEEE, pp. 205-208.
"Variable Inductance Multilayer Inductor With MOSFET Switch Control", P. Park, et al, Mar. 2004 IEEE, vol. 25, No. 3, 2004pp. 144-146.

* cited by examiner

*Primary Examiner*—Tuyen T. Nguyen
(74) *Attorney, Agent, or Firm*—Blakley, Sokoloff, Taylor & Zafman LLP

(57) ABSTRACT

There is provided a transformer for varying an inductance value, which adjusts a tuning range of the inductance without decrease of the inductor's capability by selectively connecting switches to inductors and controls an amount of magnetic flux. And the transformer consists of multiple inductors formed on a semiconductor substrate, which including N number of metal lines, N number of ports made by twisting the metal lines in the form of a symmetric circuit, wherein a certain number of ports among the N number of ports, which are connected to switch elements.

7 Claims, 9 Drawing Sheets

TRANSFORMER FOR VARYING INDUCTANCE VALUE

FIELD OF THE INVENTION

The present invention relates to a transformer; and, more particularly, to a transformer capable of adjusting an inductance tuning range of its inductors without decrease of the capability of the inductors by selectively connecting the inductors with switches attached thereto to thereby control an amount of magnetic flux.

DESCRIPTION OF RELATED ART

In FIG. 1A, there is provided a circuit diagram of a conventional planar type variable inductor, which includes serially connected two inductors and a switch connected in parallel to one of those inductors.

In case that the switch is not connected, a whole inductance value becomes L1+L2 and, if otherwise, the whole inductance value changes to L2. That is, the variable inductor can have two kinds of inductance values.

FIG. 1B is a circuit diagram of a conventional stack type variable inductor, which includes three inductors stacked up vertically and switches connected between the three inductors. In this case, according to the status of switches, it is possible to implement the variable inductor, which has various inductance values such as L1+L2+L3, L1+L2, L1+L3, L1, and so on, in a small area. And a range of the variable inductance can be changed continuously.

However, in general, since the conventional variable inductor described above is implemented by connecting many inductors serially and connecting the inductors with switches in parallel and the number of working inductors and a whole inductance value are determined according to the connecting status of the switches, the conventional variable inductor has a problem of deteriorating the whole inductor's capability.

That is, the conventional variable inductor has a limitation in terms of an area and performance. In other words, effects of switches and a large area due to serially connected inductors raise a large area problem. To overcome this problem, when stacking up inductors, it is possible to reduce the area. However, it still brings a problem in decreasing performance of the variable inductor.

In addition, in case of the conventional variable inductor, the great loss, which comes from an electric resistor or capacitor of a switch connected to an inductor can decrease the whole inductor's capability.

SUMMARY OF THE INVENTION

It is, therefore, an object of the present invention to provide a transformer capable of adjusting an inductance tuning range of its inductors without decrease of the capability of the inductors by selectively connecting the inductors with switches attached thereto to thereby control an amount of magnetic flux.

In accordance with an aspect of the present invention, there is provided a transformer, having a multiplicity of inductors formed on a semiconductor substrate, for varying an inductance value, which includes N number of metal lines, N being a positive integer, and N number of ports made by twisting the metal lines in the form of a symmetric circuit, wherein a certain number of ports among the N number of ports, which are connected to switch elements.

A more complete appreciation of the present invention and its improvements can be obtained by reference to the accompanying drawings, which are briefly summarized below, to the following detail description of presently preferred embodiments of the invention, and to the appended claims.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

The present invention relates to a variable inductor using the structure of a transformer. In general, a transformer consists of two ports. However, in the present invention, it is possible to increase the number of ports by twisting metal lines on a plane or by stacking up two metals. That is, according to the number of metal layers and twisted metal lines on a plane, it is capable of determining the number of ports. And the number of winding metals for each port can be determined according to a desired inductance value.

In order to control magnetic flux by using the transformer structure, it is practicable to produce a variable inductor by connecting switches to ports desired to control to thereby add or deduct an inductance value of each port to or from the whole inductance value.

The difference of the present invention from conventional ones is using a method of adding or deducting an amount of magnetic flux of an inductor of each port instead of using a method of removing an inductor itself from a signal flow. Therefore, there is no attenuation of a signal due to switches. Moreover, a very wide range of variation of inductance can be obtained.

The present invention relates to an element usable as a variable inductor by using a transformer, which can be used in CMOS RF ICs (Integrated Circuits). It is possible to get characteristics of broadband by using an advantage of varying inductance and applying it to a circuit used in RFIC.

A transformer structure, which is symmetric, can be classified into a planar type and a stack type, and can be implemented in 2-port, 3-port, or 4-port according to the desired form.

The present invention mainly explains the concept of a 4-port variable inductor. The basic concept is fixing an inductance value of one port among four ports to a desired value, and then by using the remained three ports, it changes inductance through varying an amount of magnetic flux generated by an electric current in each port.

The three ports have switches connected thereto and, by controlling opening or closing the switches, it can be possible to turn on electricity among the three ports selectively. It is also possible to selectively control the direction of an electric current and make the direction reversely in natural. If the electric current goes reversely, the direction of magnetic flux should be in reverse as well, resulting in the whole inductance changed to decrease.

Figure 1A:
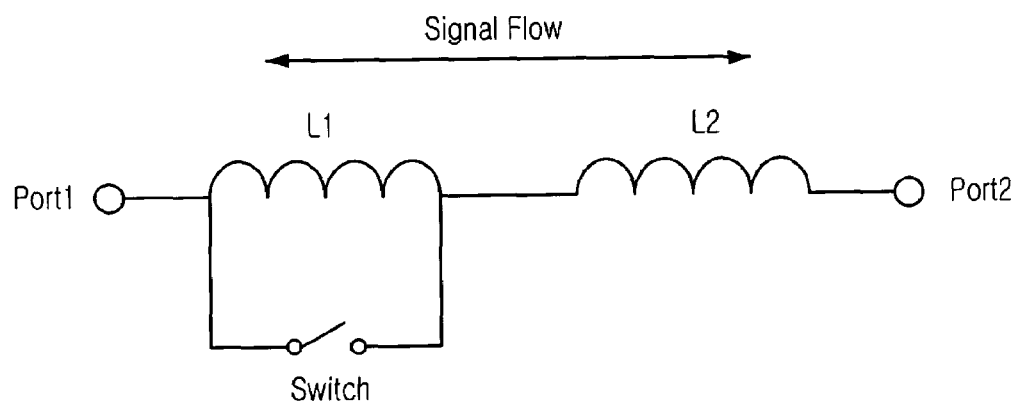
FIG. 1A shows a circuit diagram of a conventional planar type variable inductor.
Figure 1B:
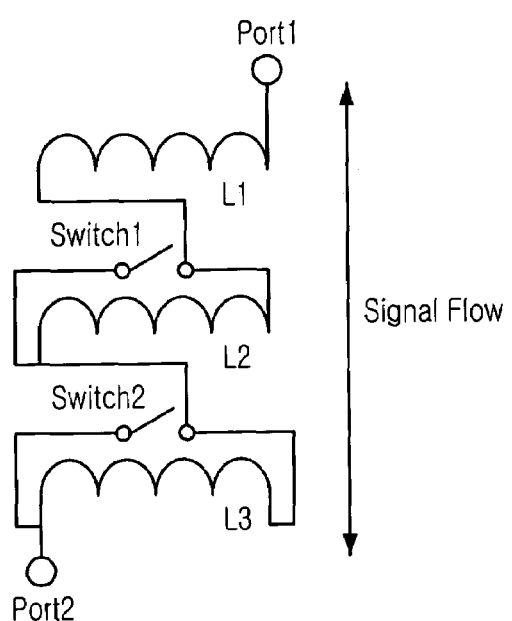
FIG. 1B is a circuit diagram of a conventional stack type variable inductor connecting inductors vertically.
Figure 2A:
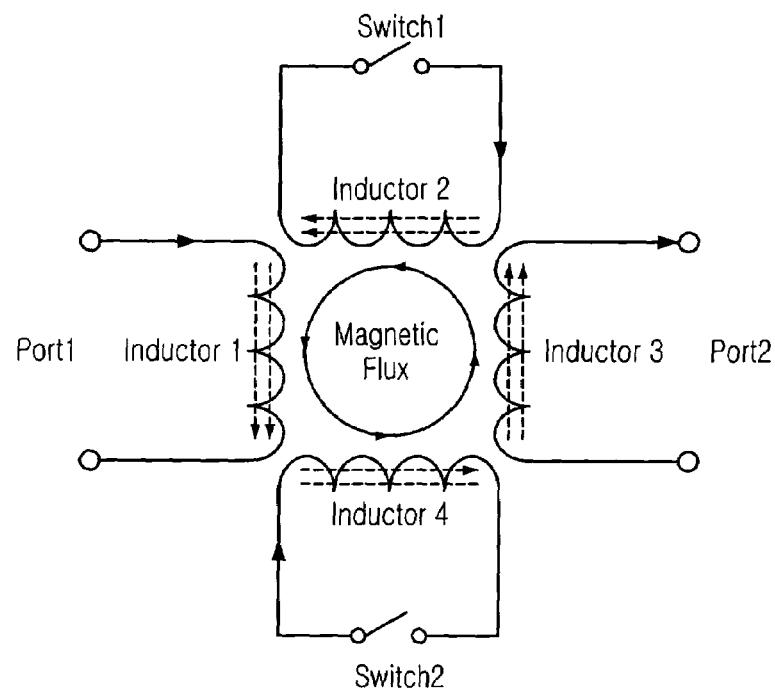
FIG. 2A presents an equivalent circuit diagram of a 2-port variable inductor using a transformer in accordance with the present invention.

FIG. 2A shows an equivalent circuit of a 2-port variable inductor using a transformer in accordance with the present invention. Except ports 1 and 2 among four ports, switches 1 and 2 are connected to the remained two ports, ports 3 and 4, so that it is capable of controlling an amount of magnetic flux flowing the inside diameter by adjusting the connection of the switches.

A signal inputted from the port 1 moves to the port 2, and in this case, the inductance of the port 1 is changed by the ports 3 and 4. That is, it is possible to find an optimized inductance value for ideal movement of signals by tuning the inductance of the port 1.

Figure 2B:
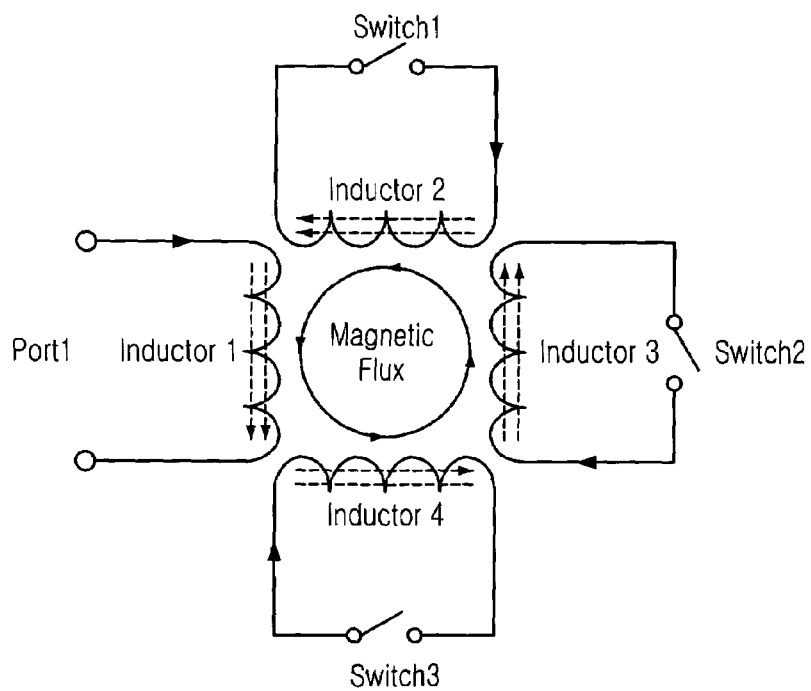
FIG. 2B describes an equivalent circuit diagram of 1-port variable inductor using a transformer in accordance with the present invention.

FIG. 2B presents an equivalent circuit diagram of a 1-port variable inductor by using a transformer in accordance with the present invention.

In this case, except a port 1 among whole four ports, switches 1, 2 and 3 are connected to ports 2, 3 and 4, respectively and control an amount of magnetic flux.

An inductance value of the port 1 can be tuned by the other ports. This structure has a transformer structure, but it works simply as an inductor in a symmetric structure and can have a wide range of varying inductance values.

Figure 3A:
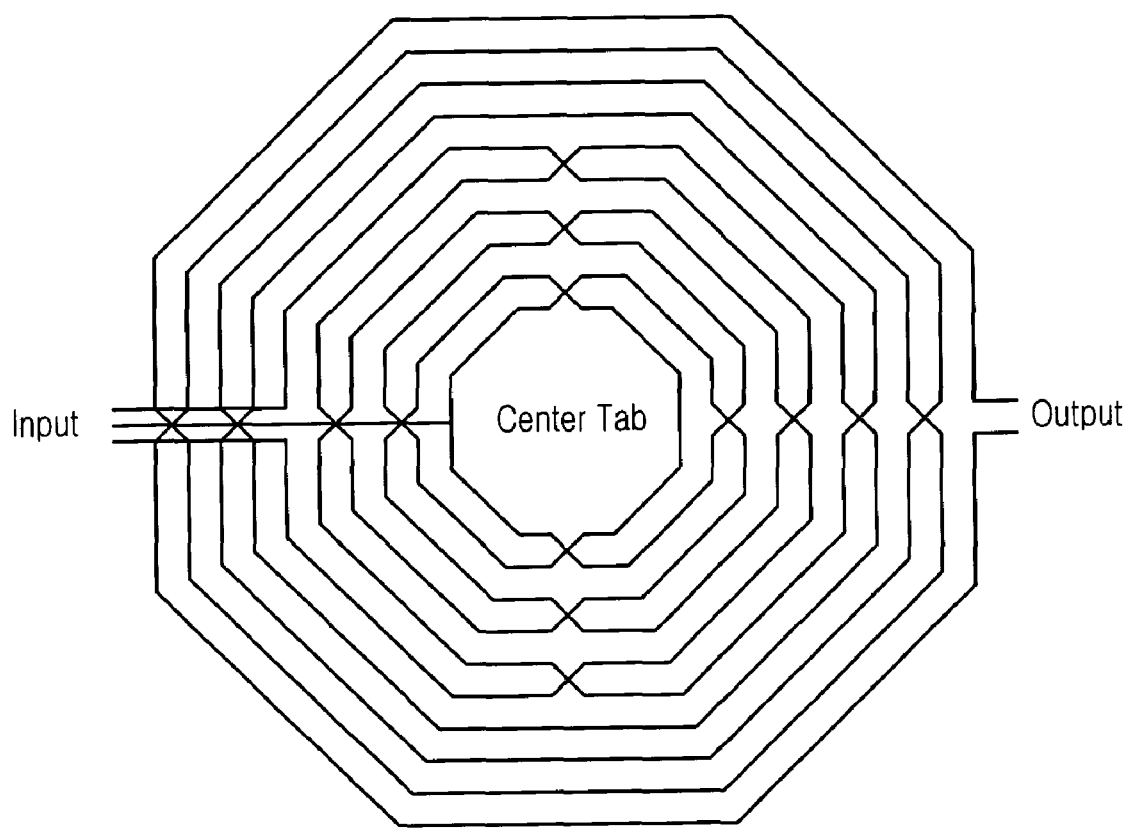
FIG. 3A depicts a transformer capable of adjusting the number of inductor's windings for each port in accordance with the present invention.

FIG. 3A depicts a transformer having a 2-port transformer structure by twisting metal lines in order to control the number of winding metals for each port.

In general, it is possible to make a 1:1 type transformer, but this structure is also applicable to the implementation of a 1:n transformer on a plane.

Figure 3B:
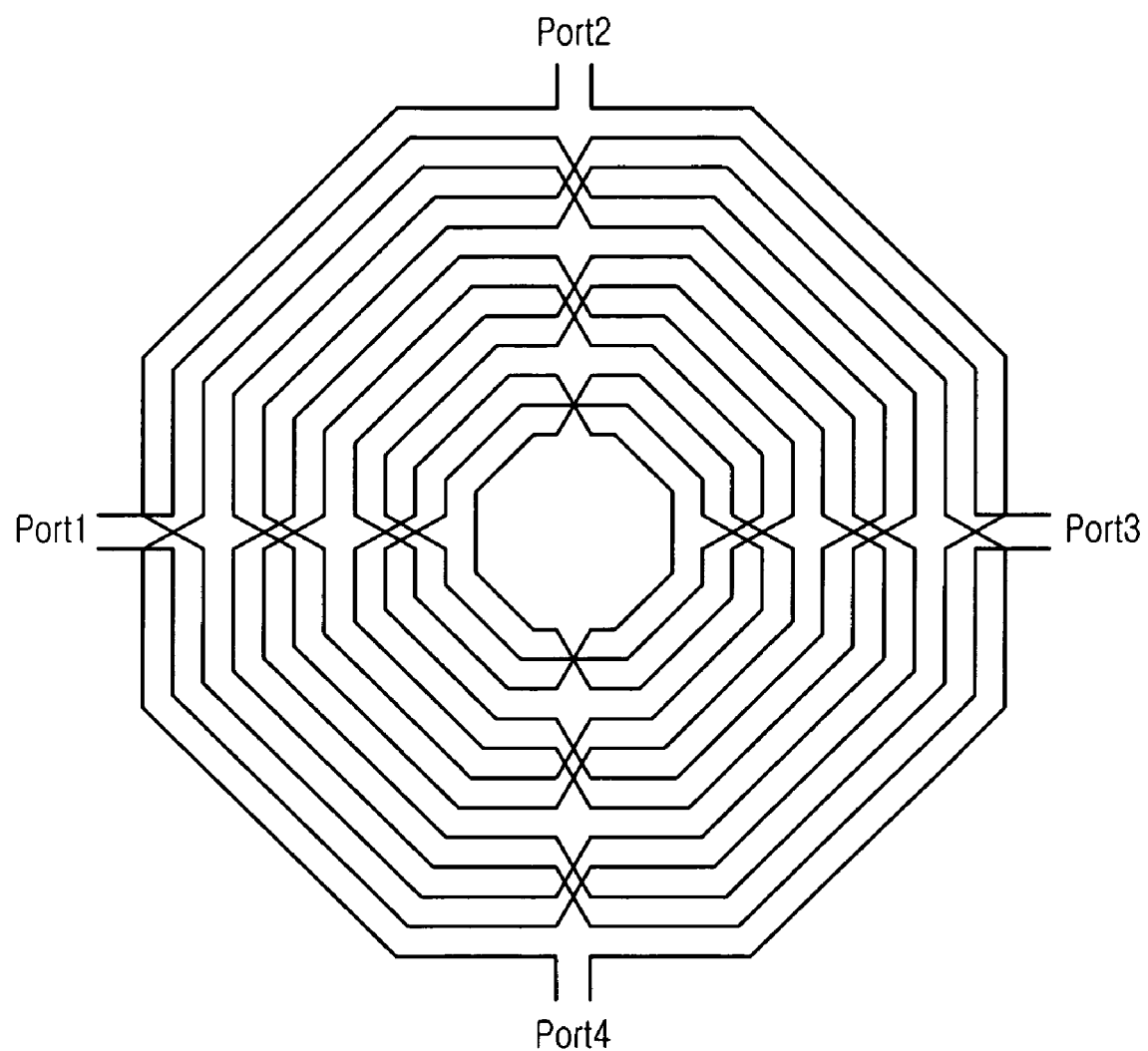
FIG. 3B illustrates a transformer having four ports in accordance with the present invention.

FIG. 3B illustrates a 4-port transformer in accordance with the present invention, which has a 1:1:1:1 ratio for number of windings for each port.

Since it is formed on a plane instead of in a stack type, area increases, however, it has an advantage of implementing many ports.

Figure 3C:
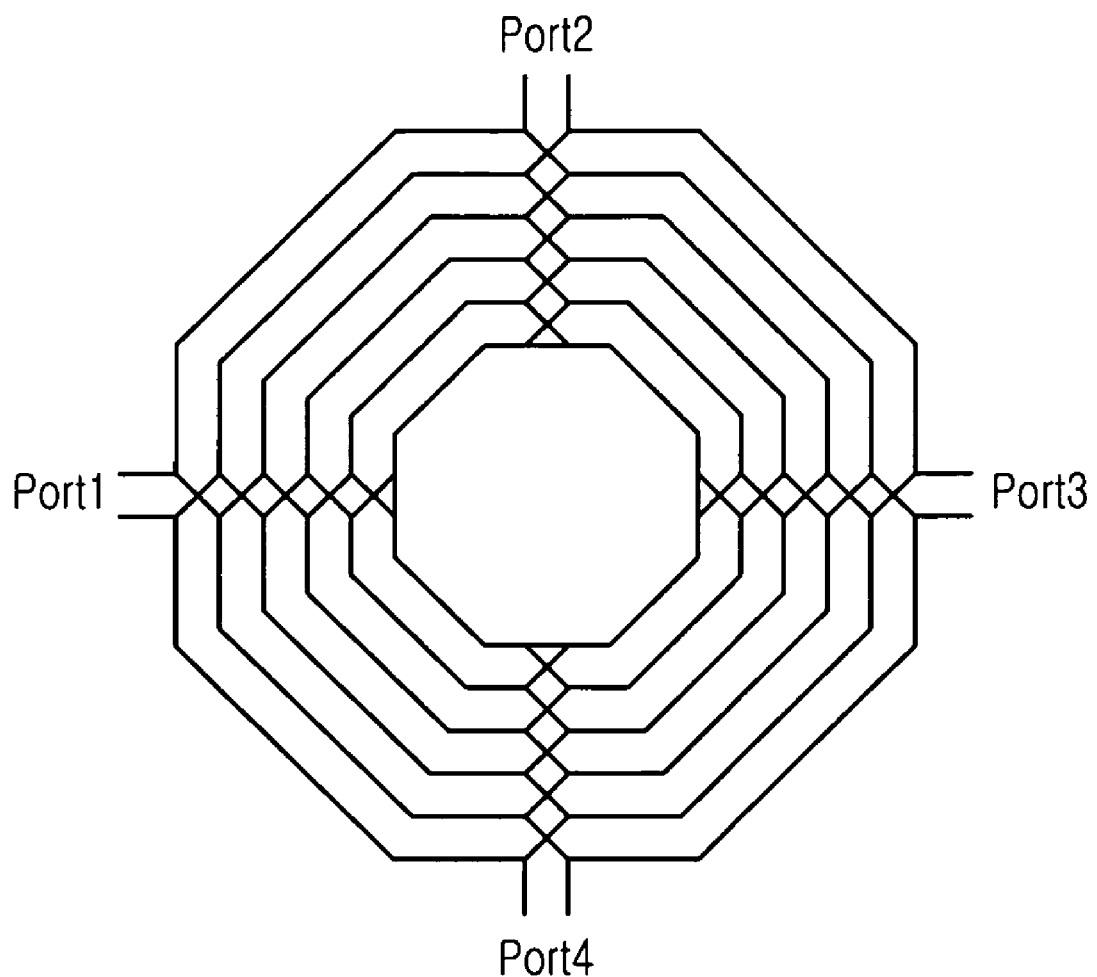
FIG. 3C provides a transformer having four ports in a planar and stack structure in accordance with the present invention.

FIG. 3C is a structural diagram of a 4-port transformer in a planar and stack structure in accordance with the present invention. In order to overcome a disadvantage of the 4-port transformer formed in a planar structure as presented in FIG. 3B, the structure having four ports is implemented by stacking up two 2-port planar structures.

In this case, it also has a 1:1:1:1 winding ratio. In particular, in this structure, according to which process is used, the total number of metals is determined. As the number of metals increases, the number of ports is also increases.

Figure 4A:
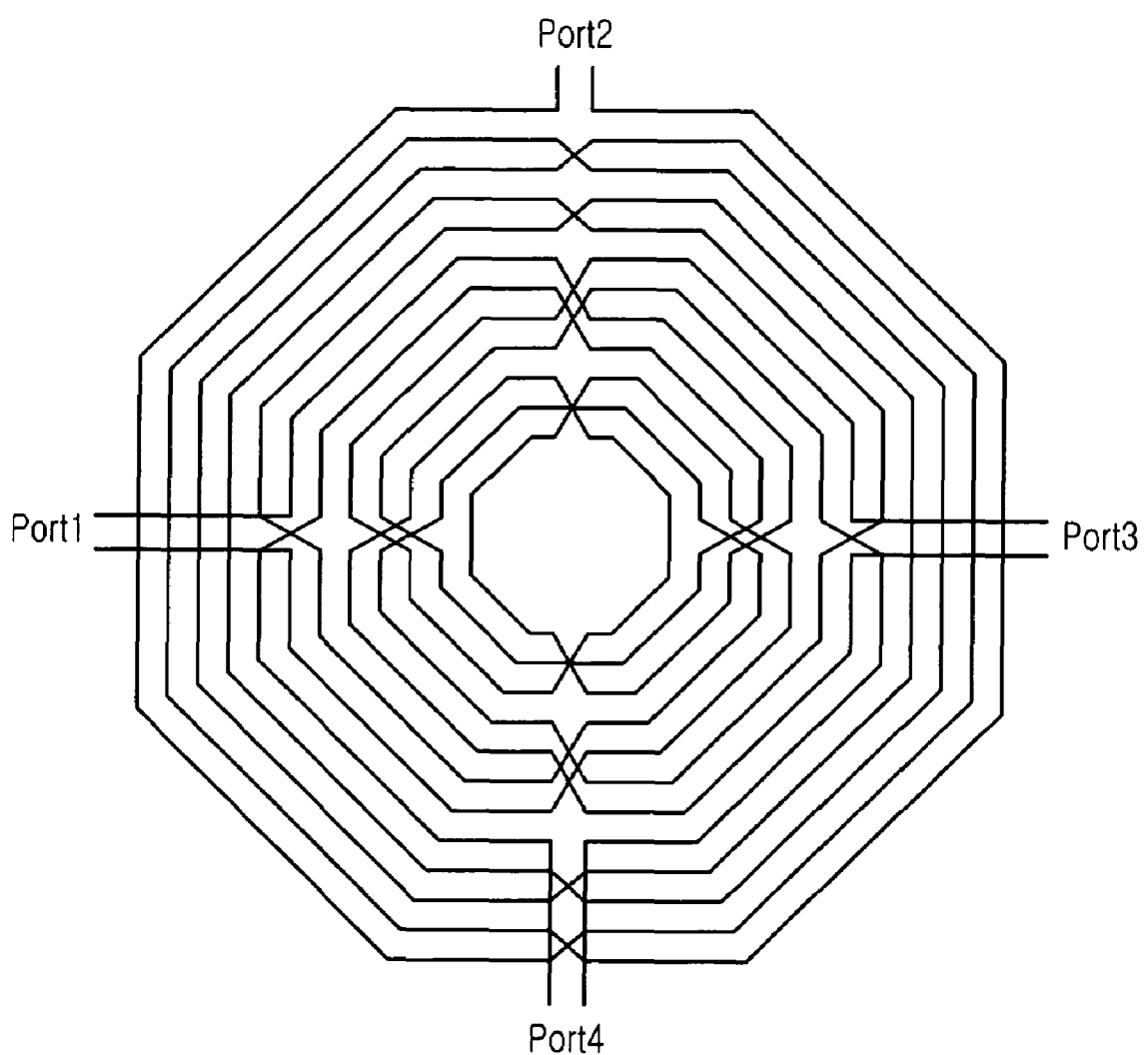
FIG. 4A describes a 4-port transformer in a planar structure for varying the number of windings for each port in accordance with the present invention.

FIG. 4A describes a 4-port transformer in a planar structure varying the number of windings for each port in accordance with the present invention. There is provided a structure capable of varying the number of windings for each port in a 1:n:m:k ratio instead of 1:1:1:1 in FIG. 3B.

Figure 4B:
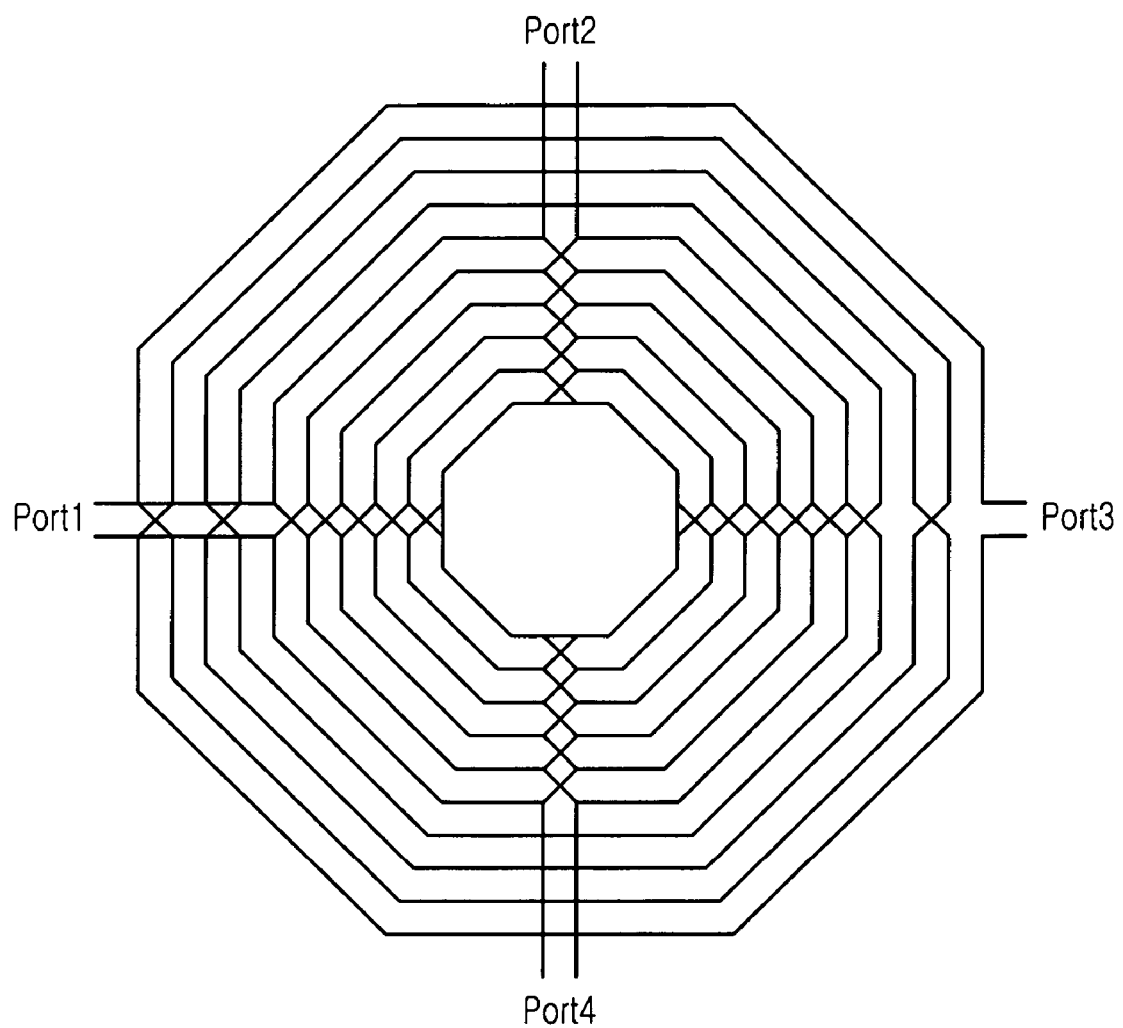
FIG. 4B shows a 4-port transformer in a planar and stack structure for varying the number of windings for each port in accordance with the present.

FIG. 4B presents a structural diagram of a 4-port transformer, which is made by stacking up the 2-port transformer presented in FIG. 3C and consists of a planar structure and a stack structure for varying the number of windings for each port.

Figure 5A:
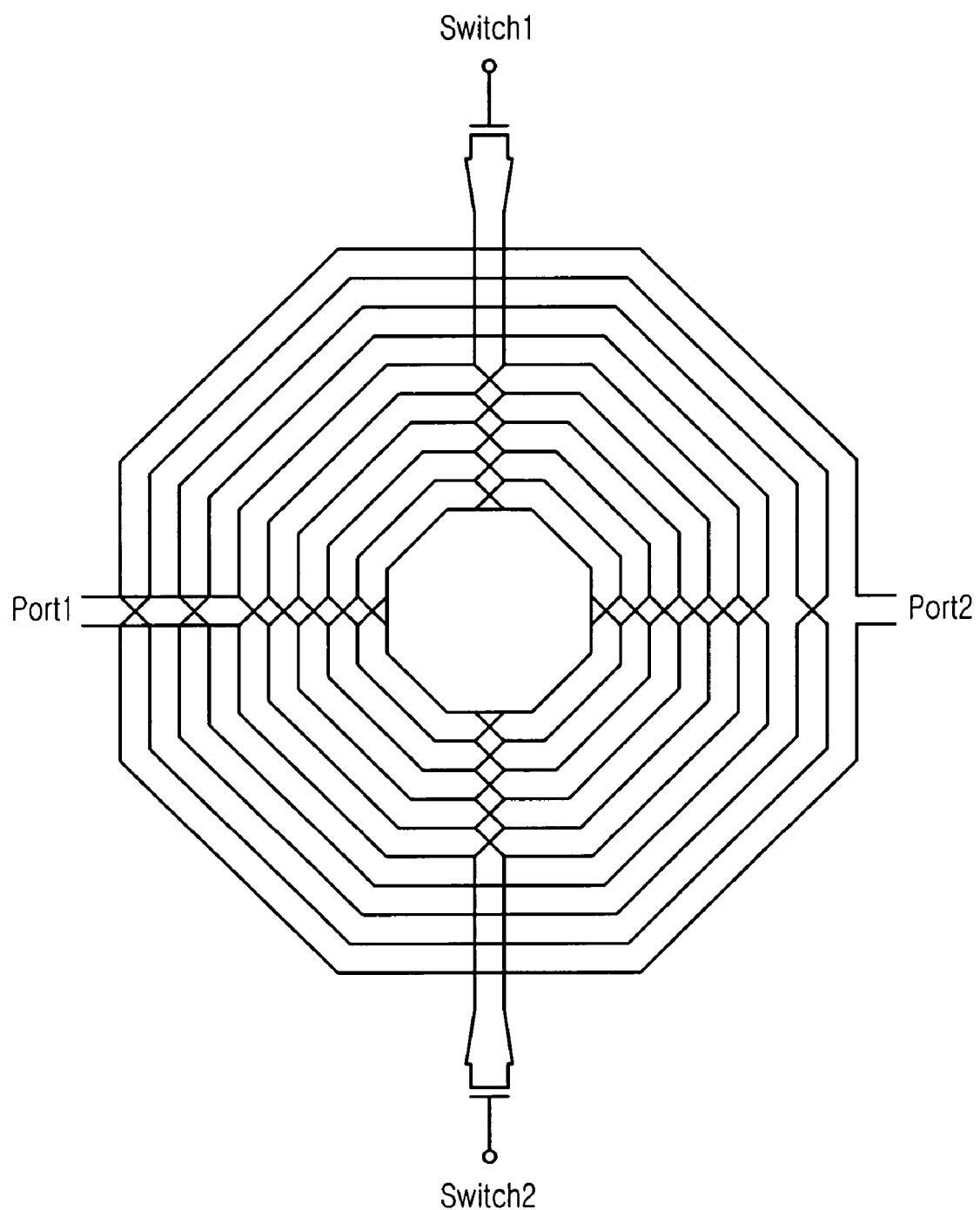
FIG. 5A presents a 2-port transformer having a variable inductor with switches connected thereto in accordance with the present invention.
Figure 5B:
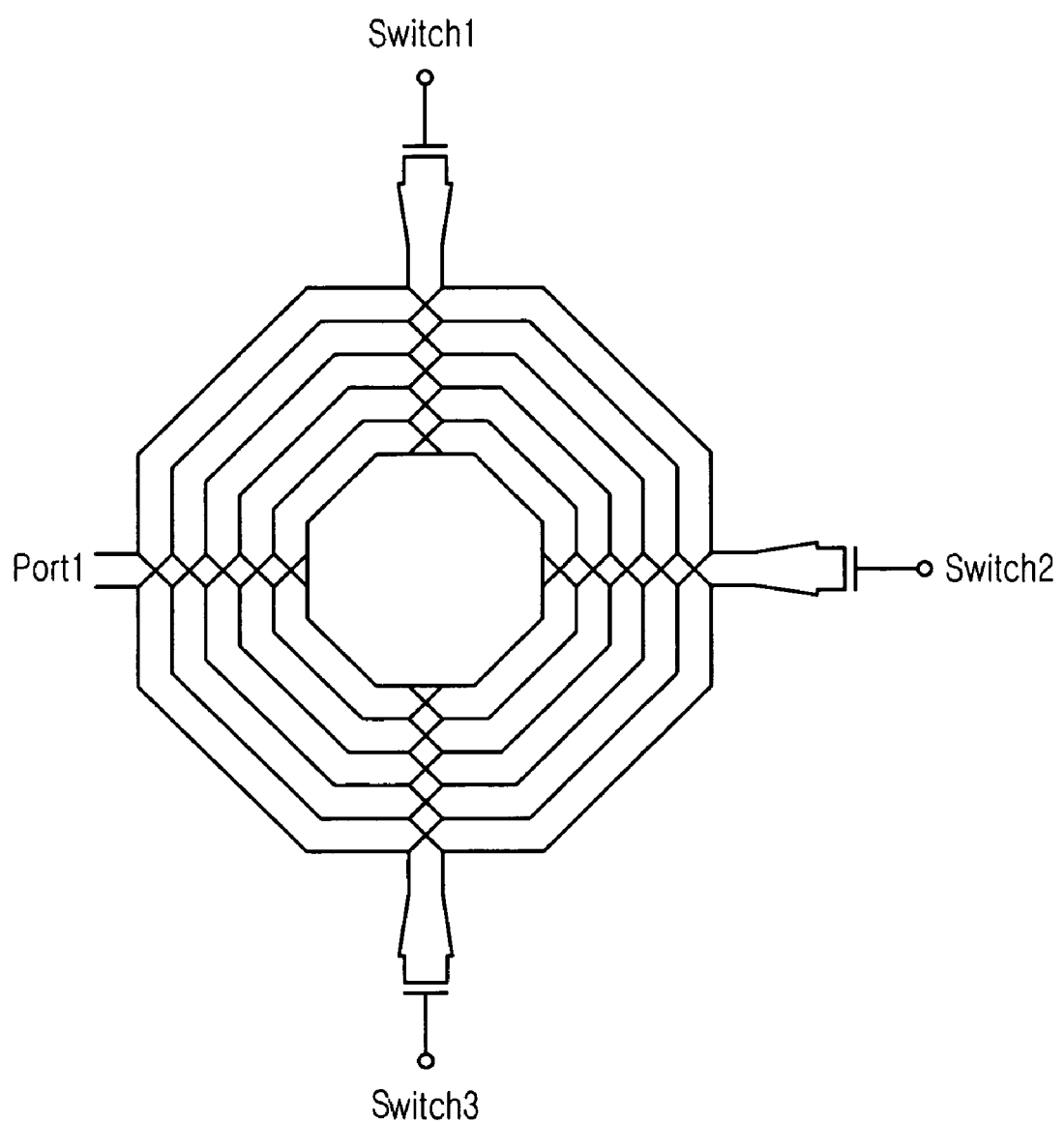
FIG. 5B is a 1-port transformer having a variable inductor with switches connected thereto in accordance with the present invention.

FIG. 5A shows a structural diagram of a 2-port transformer having a variable inductor with switches connected thereto and FIG. 5B presents a structural diagram of a 1-port transformer having a variable inductor with switches attached thereto.

In FIGS. 5A and 5B, the inductance can be varied by connecting the switches to the 4-port transformer presented before.

FIG. 5A is a drawing of practically implementing the 2-port transformer designed in FIG. 2A with a stack structure and uses general NMOS switches as the switches.

Similarly, FIG. 5B is a drawing for practically implementing the 1-port transformer described in FIG. 2B by connecting the switches to the three ports in order to thereby change the inductance.

The concept of making variable inductance is simple, however, various explanations for its implementation can be possible and ideal performance can be achieved by the inductance tuning.

Therefore, in accordance with the present invention, it is possible to adjust an inductance value without affecting a signal flow directly by using a transformer structure and, in addition, it is capable of controlling an inductance value arbitrarily according to a transformer structure.

Additionally, because switches do not lie on a signal path, a variable inductor having a transformer structure has no decrease of performance due to the switches and no limitations on account of size of the switches. A fine tuning as well as coarse tuning is possible because it is capable of controlling the number of inductor's windings used for each port freely.

In addition, in accordance with the present invention, it is possible to acquire characteristics of broadband tuning for a matching circuit of low noise amplifiers and VCO (Voltage Controlled Oscillator), and high power for PA (power amplifier).

And, in case of applying the present invention to an optical transceiver, it is possible to change a single input to a dual input by locating it between a photo diode of a receiver and a transimpedance amplifier and it can also isolate the receiver and the transimpedance amplifier. Meanwhile, in this case, it is capable of decreasing a capacitance factor by tuning the inductance.

Moreover, in accordance with the present invention, due to the variety of the inductance value, which is changed by the number of metal layers and inductors used for stacking, it is possible to determine a structure of a variable inductor and the number of windings, thereby applying it to a circuit according to the inductance value desired for the circuit.

In addition, in accordance with the present invention, as a result of adding one more variable to a circuit tuned by a conventional variable capacitor, a range of tuning increases greatly and, therefore, it is possible to design and produce a circuit, which has characteristics of a broadband and a wide tuning range.

The present application contains subject matter related to Korean patent application No. 2004-0107114, filed in the Korean Intellectual Property Office on Dec. 16, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A transformer, having a multiplicity of inductors formed on a semiconductor substrate, for varying an inductance value, which comprises:
   N number of metal lines, N being a positive integer; and
   N number of ports made by twisting the metal lines in the form of a symmetric circuit, wherein a certain number of ports among the N number of ports, which are connected to switch elements.

2. The transformer of claim 1, wherein the metal lines are twisted in a planar structure.

3. The transformer of claim 1, wherein the metal lines are twisted in a stack structure.

4. The transformer of claim 1, wherein the switch elements are connected to other remained ports except one port in order to control a total amount of magnetic flux in the transformer.

5. The transformer of claim 1, wherein the switch elements are connected to the ports except two ports in order to make the transformer work as a 2-port transformer.

6. The transformer of claim 1, wherein each of the ports has the same number of windings of the metal lines.

7. The transformer of claim 1, wherein each of the ports has a different number of windings of the metal lines.

* * * * *